United States Patent [19]

Amir et al.

[11] Patent Number: 5,434,403
[45] Date of Patent: Jul. 18, 1995

[54] METHOD AND APPARATUS FOR READING BAR CODES WITH A TELEVISION CAMERA

[75] Inventors: Israel Amir, Princeton; Frank P. Higgins, Ewing; John B. Macdonald, Princeton Junction, all of N.J.

[73] Assignee: AT&T Bell Laboratories, Murray Hill, N.J.

[21] Appl. No.: 216,389

[22] Filed: Mar. 23, 1994

[51] Int. Cl.$^6$ .............................................. G06F 7/10
[52] U.S. Cl. .................... 235/472; 235/384; 235/462; 235/471
[58] Field of Search ................ 235/384, 462, 471, 472

[56] References Cited

U.S. PATENT DOCUMENTS 4,585,931  4/1986  Duncan et al. .
4,958,064  9/1990  Kirkpatrick ......................... 235/384

OTHER PUBLICATIONS

Philips Semiconductors Data Sheet No. TDA4820T, "Sync Separation Circuit for Video Applications", Jun. 1990, pp. 2377–2381.
Sales Literature, "New Generation Programmable Bar Code Reader Uses a Video Camera as a Read Head," Label Vision Systems, Inc., Nov. 5, 1993.

*Primary Examiner*—Harold Pitts
*Attorney, Agent, or Firm*—Robert B. Levy

[57] ABSTRACT

A bar code (14) on an object (12) is read a distance from the object by a television camera. The output signal of the camera is thresholded to obtain a binary signal indicative of the image information associated with at least one scan line. This binary signal is written into a FIFO storage device (28) at a rate corresponding to the rate at which the camera images the bar code. Once the binary signal is fully written into the FIFO storage device, the binary signal is read from the FIFO at a second, much slower rate for decoding by a bar code decoder (36). In this way, the image of the bar code can be obtained by a television camera which is capable of imaging the bar code at a distance, while the image information can be decoded by a bar code decoder that operates to perform decoding at a rate much slower than the rate at which the camera acquires information.

10 Claims, 2 Drawing Sheets

METHOD AND APPARATUS FOR READING BAR CODES WITH A TELEVISION CAMERA

TECHNICAL FIELD

This invention relates to a technique for reading a bar code on an object at a distance via a television camera.

BACKGROUND OF THE INVENTION

Prior to processing a silicon wafer to make semiconductor devices, the wafer is inscribed with a bar code. As the wafer is processed, the bar code is read to track the wafer to determine what process steps have been performed. As compared to the conventional bar code printed on consumer products, such as grocery items, the bar code inscribed on a wafer is typically smaller in order to maximize the usable area on the wafer. Moreover, the contrast of the bar code on the wafer is reduced as compared to the bar code printed on a grocery item for example.

The reduced size and contrast of the bar code on a semiconductor wafer has necessitated the development of specialized bar code readers. One example of a bar code reader designed specifically to read semiconductor wafers is disclosed in U.S. Pat. No. 4,585,931, issued on Apr. 29, 1986, in the names of H. A. Duncan et al. and assigned to AT&T Technologies, Inc. The bar code reader disclosed in the Duncan et al. patent includes a rotating turntable for supporting the wafer. A source of radiant light energy serves to direct a beam of radiant light energy at a predetermined angle to the wafer surface so as to impinge on different portions of the area on the wafer containing the bar code as the wafer is rotated. A light sensor, in the form of a photocell, senses the light energy reflected from the wafer. A bar code decoder interprets the output signal of the photocell to decode the bar code on the wafer.

While the Duncan et al. bar code reader is effective to read the bar code on a semiconductor wafer, the wafer must be positioned in relatively close proximity to the light source and light sensor if the Duncan et al. reader is to operate properly. Unfortunately, during certain processing operations, the wafer cannot be situated in proximity to a conventional bar code reader, such as the one disclosed in the Duncan et al. patent. Thus, during such operations, it is not possible to detect the bar code on the wafer using such present-day readers. Moreover, the Duncan et al. bar code requires that a mechanism be provided to rotate the wafer, which adds to the reader cost and makes incorporation of the reader in various semiconductor processing applications more difficult.

Thus them is a need for a technique for reading a bar code on a remotely situated object, such as a semiconductor wafer.

SUMMARY OF THE INVENTION

Briefly, in accordance with a preferred embodiment of the invention, there is provided a technique for reading a bar code on an object at a distance. The technique is practiced by first imaging the bar code with a television camera remote from the object to yield a video signal comprised of a plurality of frames, each frame containing a plurality of generally horizontal scan lines, each possibly including a generally horizontal strip of the imaged bar code. After imaging the bar code with the television camera, at least one scan line in each frame of the television camera output signal is thresholded to yield a binary signal which varies in accordance with the bar code. The binary signal is written into a First-In First-Out (FIFO) storage device at a first rate in synchronism with the frequency of the scan lines in the video signal. After the one scan line has been fully written into the FIFO, the scan line is read from the FIFO at a second rate slower than the first rate. The scan line read from the FIFO is decoded to determine the bar code imaged by the television camera.

The bar code reading method described above allows for rapid imaging of the bar code by a television camera, yet enables the imaged information to be decoded at a much slower rate by way of a conventional bar code decoder whose decoding rate is slower than the scan rate of a television camera.

DETAILED DESCRIPTION

Figure 1:
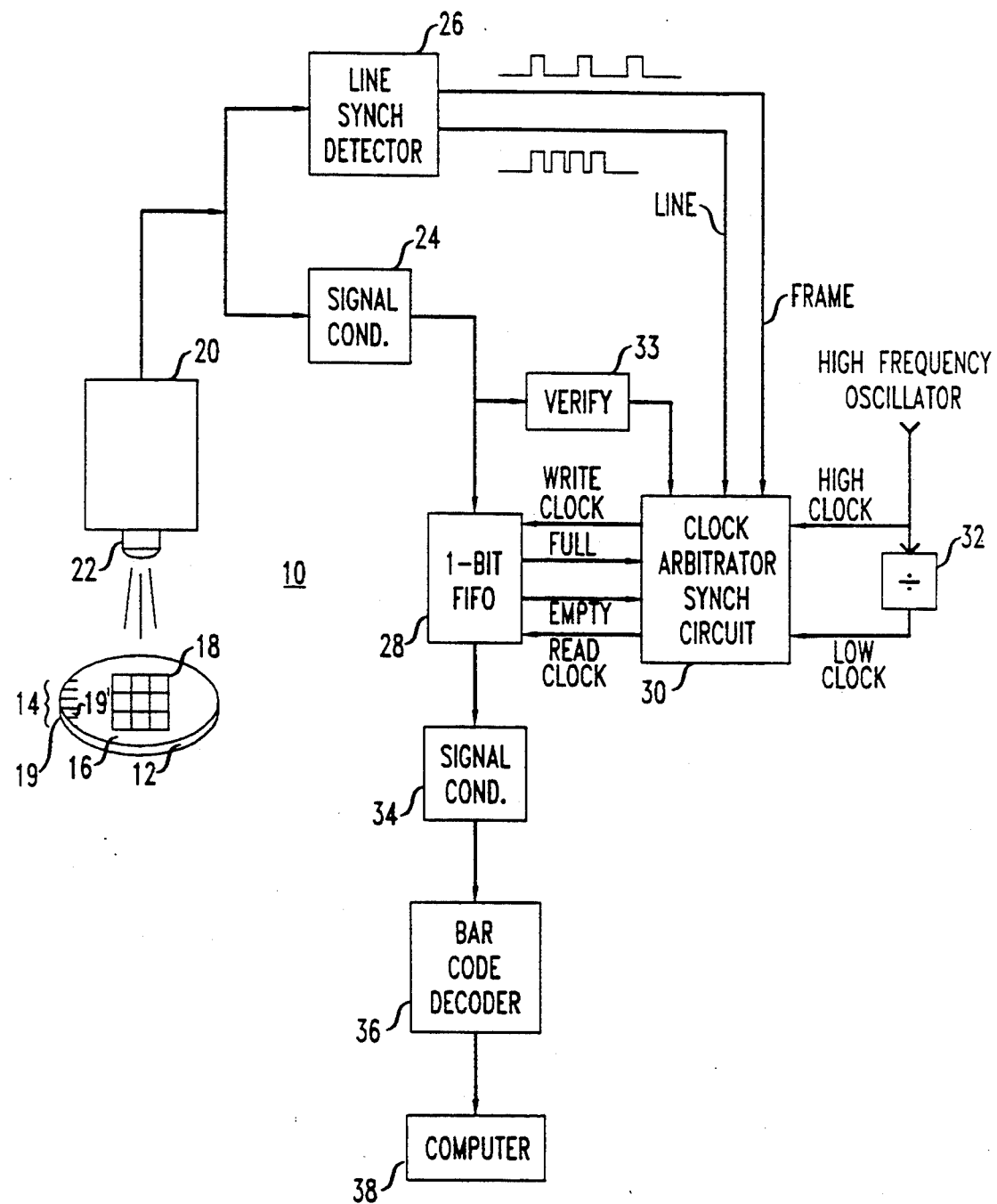
FIG. 1 is a block schematic diagram of an apparatus, in accordance with the invention, for rapidly reading a bar code on an object.

Referring to FIG. 1, there is shown an apparatus 10, in accordance with the invention, for imaging a semiconductor wafer 12 to read and decode a bar code 14 inscribed on a first major surface 16 of the wafer. The bar code 14 is comprised of a plurality of high-contrast bars 19, each adjacent pair of bars being separated from each other by a low-contrast space 19', the width of the bars and/or spaces defining the information carried by the code. In practice, the size of the bar code 14 is made small, as compared to the combined area occupied by a set of features (i.e., circuits) 18 on the wafer surface 16. By making the bar code small, the number of features 18 on the wafer surface 16 can be maximized.

The imaging apparatus 10 includes a television camera 20 of a conventional design. The camera 20 includes a lens 22 selected in connection with the optical properties of the camera 20 such that when the camera is positioned a distance from the wafer 12, the bar code 14 occupies nearly all the area within the camera field of view. At its output, the camera 20 generates an analog video signal, typically meeting the RS-170 standard. In this regard, the camera output signal contains thirty fields per second, with each field containing at least 400 scan lines. In positioning the camera, it is desirable that the bars 19 of the bar code 14 be generally orthogonal to each of the scan lines.

The video output signal of the camera 20 is supplied to a first signal conditioner 24 that typically includes an amplifier (not shown) for amplifying the video signal of the television camera 20, and a threshold circuit (not shown) in the form of a clipper or the like. The threshold circuit within the signal conditioner 24 serves to threshold the amplified camera output signal to yield a logic high or "1" level binary signal during the interval that the video signal exceeds a prescribed threshold and a logic low or "0" binary signal during the interval when the camera video signal does not reach the threshold level.

The output signal of the camera 20 is also supplied to a line synch detector 26 that is operative to strip the synch portion of the composite video signal to yield two pulse trains designated. "Frame" and "Line," corresponding to the vertical and horizontal synch components of the composite video signal. The frequency of the pulses in the Frame pulse train corresponds to the frame rate in the composite video signal, whereas the frequency of the pulses in the Line pulse train corresponds to the number of lines in each frame. In practice, the line synch detector 26 can be realized from any one of several well-known synch separation circuits, as, for example, a model TDA4820T integrated circuit available from Philips Semiconductors.

The binary output pulse trains of the signal conditioner 24 are supplied to a one-bit First-In First-Out (FIFO) storage device 28, which, as its name implies, serves to store information such that the information stored first is output first. The FIFO storage device 28 is clocked via two separate clock signals, designated as "Write" clock and a "Read" clock signal supplied by a clock arbitrator synch circuit 30 described hereinafter. The Write clock signal (typically on the order of 7.5 MHz) is selected in accordance with the number of scan lines in each frame, and the frame rate to enable the FIFO 28 to be clocked at a sufficiently fast rate to capture the image information from the signal conditioner 24 corresponding to at least one scan line in the camera 20 composite video output signal during each frame. The Read clock signal (typically 75 kHz) is selected to be much slower than (e.g. 1/100 as fast as) the Write clock signal. As will be explained hereinafter, the Read clock signal controls the rate at which the information read into the FIFO storage device 28 is read therefrom for decoding purposes. In this way, the FIFO storage device 28 is written with image information about the bar code 14 at a high rate but the stored information is read from the FIFO at a much slower rate.

The clock arbitrator synch circuit 30 generates the Write clock signal in accordance with the Frame and Line, pulse trains from the line synch detector 26. As will become better understood hereinafter with respect to FIG. 2, the Write clock signal is rendered active by the clock arbitrator synch circuit 30 so that the FIFO storage device 28 is only clocked to store image information associated with a selected scan line or lines in each frame of the composite video output signal of the camera 20. For example, to store the image information corresponding to say, the 10th scan line in each frame, the clock arbitrator synch circuit 30 maintains the Write clock signal active for an interval corresponding to this particular scan line. If image information corresponding to a different scan line or set of scan lines is to be stored, then, the Write clock signal is maintained active for an interval corresponding to such a line or lines.

Normally, the image of the bar code 14 associated with a particular scan line will be the same as that associated with the previous and succeeding scan line in the same frame although this may not always be true for isolated circumstances. For this reason, it is usually only necessary to store the image information associated with a single scan line, or at most a few scan lines in each frame. Depending on the nature of the bar code 14, it may be desirable to store the image information associated with the same scan line or set of scan lines in each frame. Alternatively, it may be desirable to store the image information associated with one scan line or set of lines in one frame and a different scan line or set of lines in a different frame.

When the FIFO storage device 28 has been completely written with the image information associated with a particular scan line or set of lines in a given frame, the FIFO storage device generates an active high "FULL" signal that is supplied to the clock arbitrator synch circuit 30. As will be discussed hereinafter with respect to FIG. 2, when the FULL signal is active high, then the clock arbitrator synch circuit 30 renders the Write clock signal inactive so that no further writing to the FIFO storage device 28 can occur.

Just as the Write clock signal is supplied to the FIFO storage device 28 to clock the device to write data thereto, the Read clock signal clocks the FIFO storage device to read data therefrom. Once the FIFO storage device 28 has been completely read, then the device generates an active high EMPTY signal that is supplied to the clock arbitrator synch circuit 30. When the EMPTY signal is active high, the clock arbitrator synch circuit 30 renders the Read clock signal inactive, preventing further reading of the F1FO storage device 28.

The Write clock signal generated by the clock arbitrator synch circuit 30 is derived from a high-frequency signal (e.g., 7.5 MHz) supplied thereto from a high-frequency oscillator (not shown). The Read clock signal is derived from a low-frequency signal (75 kHz) supplied to the clock arbitrator synch circuit 30 from a divider 32 that is supplied from the high-frequency oscillator with the high-frequency signal.

Although not critical to its operation, it may nonetheless be desirable to inhibit the clock arbitrator synch circuit 30 from rendering its Write clock signal active to clock the FIFO storage device 28 should the binary signal received from the signal conditioner 24 not be representative of the bar code 14. To this end, that apparatus 10 may be provided with a verifier circuit 33, responsive to the output signal of the signal conditioner 24, for determining if the bar code 14 has indeed been imaged and for alerting the clock arbitrator synch circuit 30 accordingly. The actual structure of the verifier 33 depends on the degree of verification that is desired. In its simplest form, the verifier 33 could be configured of a high-pass filter operative to determine if the signal conditioner 24 output signal had at least one undulation, a characteristic that would be present in the signal conditioner output signal if a bar code were present. If an exact verification were necessary, then the verifier circuit 33 could itself be configured of a bar code decoder, as are known in the art.

The output information read from FIFO storage device 28, when the FIFO storage device is clocked by the Read clock signal, is processed by a second signal conditioner 34 before being supplied to a bar code decoder 36 under the control of a computer 38, typically a PC. The second signal conditioner 34 includes an amplifier in combination with a DC offset circuit (not shown) for amplifying the information read from the FIFO storage device 28 and for offsetting its DC value.

Depending on the nature of the bar code 14, the second signal conditioner may include additional circuitry for performing other signal conditioning. For example, when the bar code 14 is a "412" code, as is known in the art, it may be useful for the signal conditioner 34 to condition the information read for the FIFO storage device such that each time a bar 19 is found to be present, a minimum width space is inserted. The reason for conditioning the information for the 412 bar code in this fashion is that the strips of high contrast (i.e., the bars 19) in the 412 code are of the same width. Thus, each time a strip of high contrast is detected in the 412 bar code, such a strip should be followed by one of low contrast. By conditioning the image information of the 412 bar code in this way, processing of the information is enhanced. Note that such conditioning of the 412 bar code image information need not necessarily occur within the second signal conditioner 34 but could easily occur within the bar code decoder 36, or could be accomplished by a separate circuit (not shown) in the signal path between the FIFO storage device 28 and the bar code decoder.

The bar code decoder 36 comprises a conventional bar code decoder such as the one manufactured by Interface Mechanisms Corp. (INTERMEC), Lynn, Washington. In response to a signal from the clock arbitrator 32, indicating that the FIFO storage device 28 is being clocked at the Low Clock rate, the bar code decoder 36 decodes the information read from the FIFO storage device and conditioned by the second signal conditioner 34 to discern the bar code 14 on the wafer 12.

Figure 2:
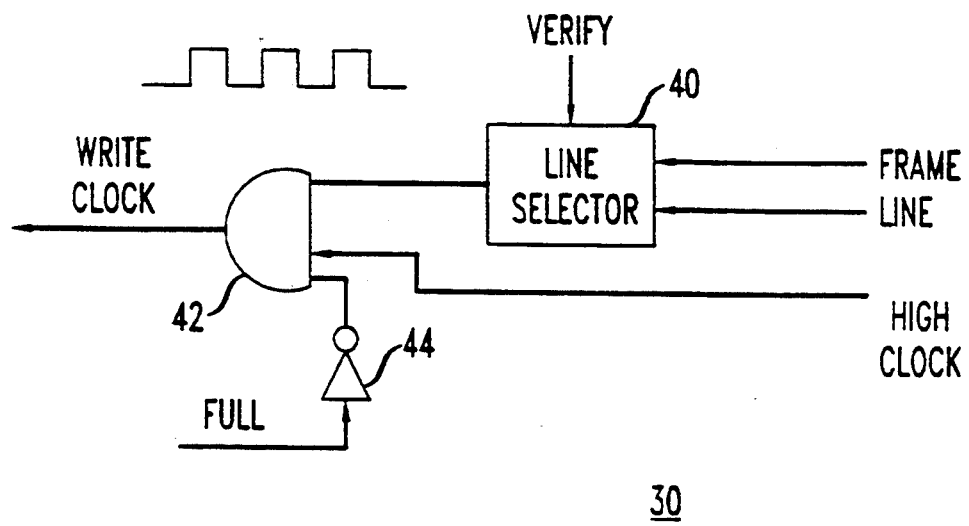
FIG. 2 is a block schematic diagram of a clock arbitrator circuit within the apparatus of FIG. 1.
Figure 2:
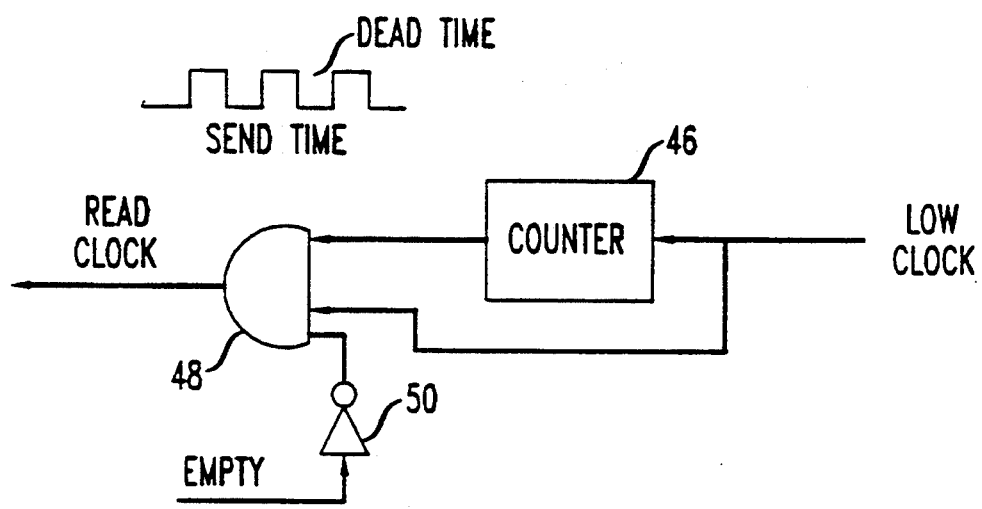

Referring now to FIG. 2, there are shown the details of the clock arbitrator synch circuit 30. To generate the Write clock signal in accordance with the Frame and Line pulse trains that are generated by the line synch detector 26 of FIG. 1, the clock arbitrator synch circuit 30 includes a line selector circuit 40. The line selector circuit 40 takes the form of a programmable counter clocked by the Frame pulse train so as to generate a pulse whose duration corresponds to a particular pulse or set of pulses in the Line pulse train. In other words, the line selector circuit 40 generates a pulse during each frame of the composite video output signal of the camera 20 of FIG. 1. The point at which the pulse occurs corresponds to a particular scan line in that frame, and the duration of the pulse corresponds to the interval required to write the image information associated with that particular scan line or set of scan lines into the FIFO storage device 28.

The line selector circuit 40 of FIG. 2 is also responsive to the output signal of the verifier circuit 33 of FIG. 1. Should the verifier circuit 33 determine that the image information obtained from the signal conditioner 24 does not correspond to the image of a bar code, then the line selector 40 is inhibited from generating its output pulse train by a signal from the verifier circuit. Under this circumstance, the Write clock signal will be inhibited.

The output signal from the line selector 40 is ANDed by an AND gate 42 with the High clock signal and with the output signal of a NOT gate 44 supplied at its input with the FULL signal from the FIFO storage device 28 of FIG. 1. The output signal of the AND gate 44 serves as the Write clock signal for the FIFO storage device 28. As may be appreciated, the Write clock signal is active only during an interval corresponding to selected scan line or lines, as determined by the line selector 40, and only if, at the same time, the FIFO storage device 28 is not full. During other intervals, the Write clock signal is inactive.

To generate the Read clock signal, the clock arbitrator synch circuit 30 includes a counter 46 that is programmed to generate a series of pulses in response to the Low clock signal such that each pulse output by the counter has a duration, designated SEND TIME, that corresponds to the product of the Low clock signal period and the number of bits to be stored in the FIFO storage device for a particular scan line. The output signal of the counter 46 is ANDED by an AND gate 48 with the Low clock signal and with the output signal of a NOT gate 50 supplied at its input with the EMPTY signal from the FIFO storage device 28 of FIG. 1. In this way, the Read clock signal is active for an interval sufficient to read all of the bits associated with the particular scan line stored in the FIFO storage device 28, provided that the FIFO storage device is not yet empty. Once all of the bits associated with the particular scan line have been read, or the FIFO storage device 28 becomes empty before reading, then the Read clock signal becomes inactive.

The foregoing discloses a scheme for reading the bar code 14 on a wafer 12 at a distance via the television camera 20. Typically, the television camera 20 operates to scan the image of the bar code at a high rate so a FIFO storage device 28 is provided to allow storage of the camera output signal at a high rate while allowing the stored image information to be read out at a slower rate for decoding by a conventional bar code decoder 36. In this way, the bar code can be imaged remotely via the television camera, yet, the image information can be decoded by a conventional bar code decoder 36 that operates at a rate slower than the camera.

It is to be understood that the above-described embodiments are merely illustrative of the principles of the invention. Various modifications and changes may be made thereto by those skilled in the art which will embody the principles of the invention and fall within the spirit and scope thereof.

We claim:

1. A method for rapidly reading a bar code on an object at a distance, comprising the steps of:
    imaging the bar code on the object with a television camera situated remote from the camera to yield a video signal comprised of a plurality of frames, each frame containing a plurality of scan lines, each scan line having image information associated therewith representing the image of a strip across the bar code;
    conditioning the image information associated with at least one scan line in each successive frame to yield a binary signal indicative of the image information associated with said one scan line;
    storing said binary signal, indicative of the image information associated with said one scan line, in a First-in, First-Out (FIFO) storage device at a first clock rate;
    reading said binary signal from said FIFO storage device at a second clock rate slower than the first clock rate after the binary signal has been fully written into said FIFO's storage device; and
    decoding said binary signal to determine the bar code on the object.

2. The method according to claim 1 wherein the image information associated with said one scan line is conditioned by first amplifying said information and thereafter thresholding it.

3. The method according to claim 1 further including the steps of:
    detecting the occurrence of every scan line in each frame;
    determining, from the occurrence of every scan line, the occurrence of said one scan line;
    enabling said FIFO storage device to be clocked at said first rate for the duration of said one scan line so that the binary signal indicative of the image information associated with said one scan line is written in said FIFO storage device.

4. The method according to claim 1 further including the step of conditioning the binary signal read from said FIFO storage device prior to decoding.

5. The method according to claim 4 wherein said conditioning step includes the step of modifying said binary signal to cause the signal to reflect a low contrast (space) portion in the binary code so that said space portion follows each high contrast (bar) portion.

6. The method according to claim 1 wherein the binary signal is only stored if the signal is indicative of a bar code.

7. Apparatus for reading a bar code on an object at a distance therefrom, comprising:
   a television camera for imaging the bar code on the object at a distance and for generating a video signal comprised of a plurality of frames, each frame including a plurality of scan lines, each scan line having image information associated therewith corresponding to the image of a strip across the bar code;
   a first signal conditioner coupled to the television camera for conditioning the image information associated with at least one predetermined scan line to yield a binary signal indicative of said image information;
   a First-In, First-Out storage device coupled to the first signal conditioner for storing the binary signal produced by the first signal conditioner;
   clock means coupled to the television camera and to the FIFO storage device for clocking the FIFO storage device at a first clock rate during the duration of said one predetermined scan line so that the binary signal indicative of the image information associated with said one predetermined scan line can be stored in the FIFO device and for clocking the FIFO storage device at a second rate, slower than said first rate, after said binary signal has been written into the FIFO storage device, to enable said binary signal to be read therefrom; and
   a bar code decoder coupled to the FIFO storage device means for decoding the binary signal read from the FIFO storage device.

8. The apparatus according to claim 7 wherein the bar code decoder means comprises:
   a second signal conditioner for conditioning the binary signal read from the FIFO storage device;
   a bar code decoder coupled to the second signal conditioner for decoding the signal conditioned by the second signal conditioner.

9. The apparatus according to claim 7 wherein the clock means comprises:
   a line synch detector coupled to the television camera and responsive to a camera output signal for indicating the duration of each scan line in each frame;
   a clock arbitrator coupled to the line synch detector and responsive to the indication provided thereby as to the duration of each scan line for determining the duration of said one predetermined scan line; and
   gate means coupled to said clock arbitrator and controlled thereby to clock the FIFO storage device at the first clock rate during the duration of said one predetermined scan line and for clocking the FIFO storage device at the second rate once said binary signal has been completely written therein.

10. The apparatus according to claim 7 further including means for verifying that the binary signal produced by said first signal conditioner is representative of a bar code and inhibiting said FIFO storage device from storing said binary signal if it is not representative of a bar code.

* * * * *